United States Patent
Zeng et al.

(10) Patent No.: US 10,373,371 B2
(45) Date of Patent: Aug. 6, 2019

(54) GENERATING SLICING DATA FROM A TREE DATA STRUCTURE

(71) Applicant: Hewlett-Packard Development Company, L.P., Houston, TX (US)

(72) Inventors: Jun Zeng, Sunnyvale, CA (US); Pu Huang, Los Angeles, CA (US); Sebastia Cortes, Barcelona (ES); Scott A. White, Barcelona (ES); Gary J. Dispoto, Mountain View, CA (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 165 days.

(21) Appl. No.: 15/523,331

(22) PCT Filed: Jan. 30, 2015

(86) PCT No.: PCT/US2015/013869
§ 371 (c)(1),
(2) Date: Apr. 28, 2017

(87) PCT Pub. No.: WO2016/122625
PCT Pub. Date: Aug. 4, 2016

(65) Prior Publication Data
US 2017/0249782 A1 Aug. 31, 2017

(51) Int. Cl.
*B33Y 30/00* (2015.01)
*B33Y 50/00* (2015.01)
(Continued)

(52) U.S. Cl.
CPC .......... *G06T 17/005* (2013.01); *B29C 64/386* (2017.08); *B33Y 30/00* (2014.12);
(Continued)

(58) Field of Classification Search
CPC ....... G06T 17/005; G06T 17/00; G06F 17/50; B33Y 30/00; B33Y 50/00; B29C 67/0088; B29C 64/386
See application file for complete search history.

(56) References Cited

U.S. PATENT DOCUMENTS

2003/0208296 A1\* 11/2003 Brisson .................. G16H 50/50
700/117
2010/0082703 A1 4/2010 Zhou et al.
(Continued)

FOREIGN PATENT DOCUMENTS

EP 2051533 A2 4/2009

OTHER PUBLICATIONS

Xiaojun Wu, Weijun Liu, Tianran Wang, "Voxel-based model and its application in advanced manufacturing," Proc. SPIE 5444, Fourth International Conference on Virtual Reality and Its Applications in Industry, (Mar. 19, 2004).\*
(Continued)

*Primary Examiner* — King Y Poon
*Assistant Examiner* — Vincent Peren
(74) *Attorney, Agent, or Firm* — HP Inc. Patent Department

(57) ABSTRACT

An example technique for generating slice data from the tree data structure representation of a three dimensional (3-D) object can include obtaining a shape specification of the 3-D object and obtaining a material specification of the 3-D object. The example technique for generating slice data from the tree data structure representation of a 3-D object can also include merging the shape specification and the material specification to create a tree data structure representation of the 3-D object. The example technique for generating slice data from the tree data structure representation of a 3-D object can also include generating slice data from the tree data structure.

15 Claims, 7 Drawing Sheets

(51) Int. Cl.
*B29C 64/386* (2017.01)
*G06T 17/00* (2006.01)
*G06F 17/50* (2006.01)

(52) U.S. Cl.
CPC .............. *B33Y 50/00* (2014.12); *G06F 17/50* (2013.01); *G06T 17/00* (2013.01)

(56) References Cited

U.S. PATENT DOCUMENTS

| | | |
|---|---|---|
| 2011/0087350 A1 | 4/2011 | Fogel et al. |
| 2013/0066812 A1 | 4/2013 | Nehhie et al. |
| 2014/0031967 A1 | 1/2014 | Unger |
| 2014/0046469 A1 | 2/2014 | Bickel et al. |
| 2014/0055570 A1 | 2/2014 | Dehais et al. |
| 2014/0282328 A1 | 9/2014 | Fried et al. |
| 2014/0324204 A1* | 10/2014 | Vidimce ............. B29C 67/0088 700/98 |

OTHER PUBLICATIONS

Bernd Bickel, et al: "Design and Fabrication of Materials with Desired Deformation Behavior", ACM Transactions on Graphics, Article 63, vol. 29, No. 4, Jul. 2010, 10 pages.

Kiril Vidimce, et al: "OpenFab:A Programmable Pipeline for Multi-Material Fabrication", ACM Transactions on Graphics, vol. 32, No. 4, Article 136, Jul. 2013, 12 pages.

International Search Report & Written Opinion received in PCT Application No. PCT/US2015/013869, dated Oct. 8, 2015, 11 pages.

* cited by examiner

GENERATING SLICING DATA FROM A TREE DATA STRUCTURE

BACKGROUND

Three dimensional (3-D) printing is a term commonly used to describe processes used to make 3-D objects. In 3-D printing, an additive process may be used to successively layer material to create a 3-D object. The 3-D objects can be virtually any shape but are generally limited to a single material. The resolution of a printed 3-D object is limited by the resolution of a 3-D printer used to print the 3-D object.

DETAILED DESCRIPTION

Generating slice data from a tree data structure can include obtaining a shape specification of the 3-D object and a material specification of the 3-D object. As used herein, a tree data structure is an ordered collection of nodes. A 3-D object is an object that can be represented along an x-axis, a y-axis, and a z-axis. A shape specification defines a shape (e.g., geometry) of a 3-D object. A material specification defines a material(s) and/or material properties (e.g., elasticity, strength, and/or color, among other material properties) that form the 3-D object. Generating slice data from a tree data structure can also include merging the shape specification and the material specification to create a tree data structure representation of the 3-D object. Generating slice data from a tree data structure representation of a 3-D object can also include generating slicing data from the tree data structure.

In a number of other approaches, 3-D printing may be performed using unstructured surface meshes with a single material per 3-D object. Such approaches are typically limited to a single material per 3-D object printed.

In an effort to address such a limitation (e.g., limitation of a single material per 3-D object printed) a number of other approaches may rely on a central processing unit (CPU) based desktop applications to generate data that may be used by a 3-D printer to generate a 3-D object. However, even in such CPU based applications, use of multiple materials may rely on assignment of a respective material to each unstructured surface mesh by hand (i.e., by a user of the 3-D based desktop application). As a result, in such approaches the material is dependent on shape of the object. Further, assigning a single material to each mesh by hand is time intensive, does not provide a reusable material template, and/or does not provide continuous gradation between multiple materials, among other deficiencies. Moreover, such approaches may not be able to print 3-D objects that are represented by complex and/or sizable data sets. For example, a 3-D printer may have insufficient hardware and/or memory to receive and/or store a large data set provided by a CPU based desktop application (e.g., provided as a single package of data to the printer).

In contrast, a number of examples of the present disclosure provide an ability to define a shape of a 3-D object independently of the material makeup of the 3-D object. Defining the material makeup of the 3-D object independently of the shape of the 3-D object can provide the ability to scale a model created from the material makeup and the shape of the 3-D object according to the resolution of a 3-D printer. Further, defining the material makeup of the 3-D object independently of the shape of the 3-D object provides an ability to provide continuous gradation between multiple materials and an ability to create templates of the materials that can be reused, among other advantages.

Figure 1:
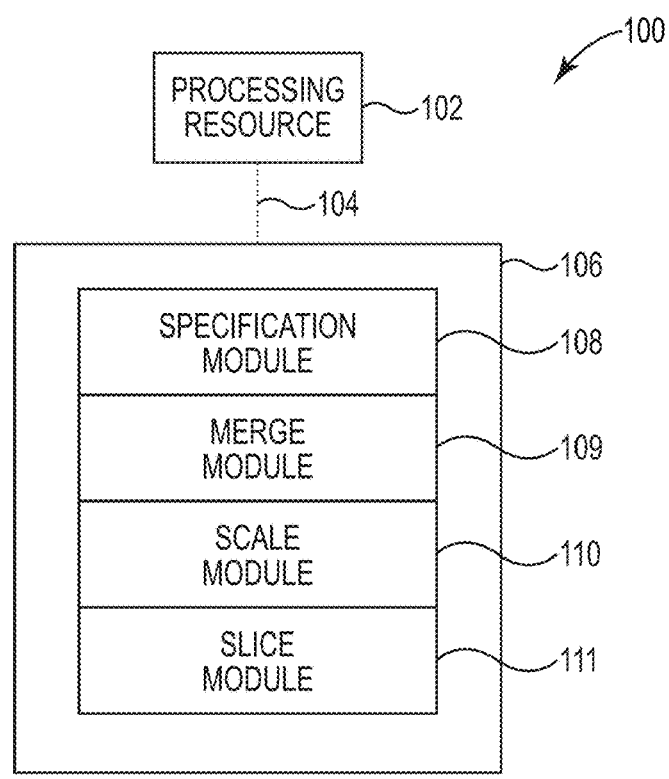
FIG. 1 illustrates a block diagram of an example of a computing device according to the present disclosure.

FIG. 1 illustrates a block diagram of an example of a computing device according to the present disclosure. The computing device 100 can include a processing resource 102 connected 104 to a memory resource 106, (e.g., a computer-readable medium (CRM)), machine readable medium (MRM), database, etc. The memory resource 106 can include a number of computing modules. The example of FIG. 1 shows a specification module 108, a merge module 109, a scale module 110, and a slice module 111. As used herein, a computing module can include program code, (e.g., computer executable instructions, hardware, firmware, and/or logic), but includes at least instructions executable by the processing resource 102, (e.g., in the form of modules), to perform particular actions, tasks, and functions described in more detail herein in reference to FIGS. 3-8.

The specification module 108, as used herein and as will be explained in more detail in connection with FIGS. 2 and 3, can include instructions that are executed by the processing resource 102 to create and/or receive a number of shape specifications and/or a number of material specifications. The shape specifications can describe the shape (e.g., geometry) of the 3-D object. For example, a single shape specification can describe the 3-D object or each of a plurality of shape specifications can describe a plurality of portions of the 3-D object. The material specifications can describe the materials and/or a number of properties associated with the material(s) that form the 3-D object. The material specification can be defined by a plurality of material property values.

A merge module 109 includes instructions that are executed by the processing resource 102 to merge the number of shape specifications with the number of material specifications. The shape specifications and the material specifications can be merged to create a model (e.g., single model) of the 3-D object. FIG. 3 further describes the result of merging the shape specification with the material specification.

A scale module 110 includes instructions that are executed by the processing resource 102 to scale the model created by merge module 109 based on a resolution associated with a 3-D printer. The scale module 110 can scale the model to provide a higher resolution, a lower resolution, or to maintain a same resolution as provided by the model before executing the scale module 110.

A slice module 111 includes instructions that are executed by the processing resource 102 to provide slice data. Slice data is data derived from the model of the 3-D object that can be provided to and used by the 3-D printer to print the 3-D object. The slice data is further described in FIGS. 3 and 6-7.

The number of modules shown in FIG. 1 (e.g., specification module 108, merge module 109, scale module 110, and slice module 111) can be combined with other modules or be sub-modules of other modules. The modules can be stored in a memory resource 106 as shown in FIG. 1 and/or be contained within the same computing device. In another example, the number of modules (e.g., specification module 108, merge module 109, scale module 110, and slice module 111) can comprise individual modules at separate and distinct locations on different memory resources (e.g., CRM, etc.) such as in a distributed computing environment, (e.g., cloud computing environment). Further, the processing resource 102 executing instructions associated with a particular module, (e.g., specification module 108, merge module 109, scale module 110, and slice module 111), can function as an engine, such as the example engines shown in FIG. 2. As used herein, the number of modules and/or the number of engines can include more or less engines/modules than those shown.

Figure 2:
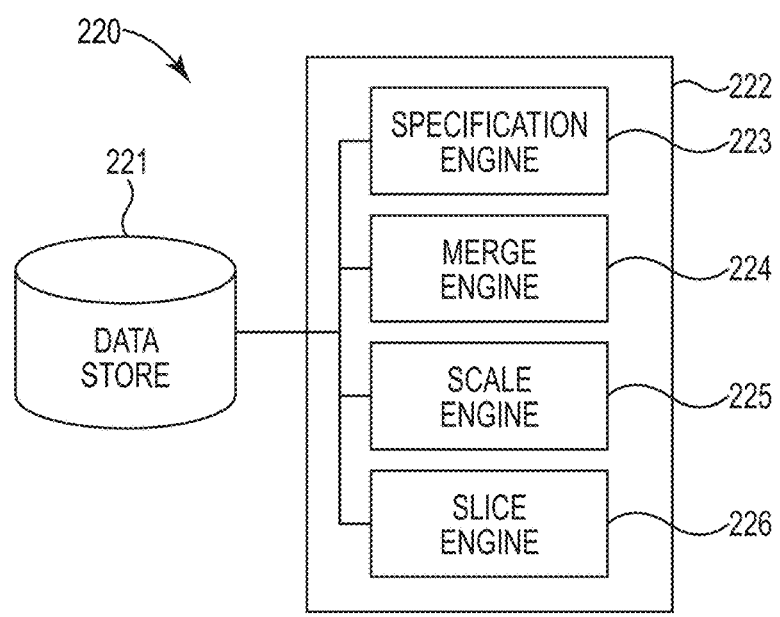
FIG. 2 illustrates a block diagram of an example of a system to generate slice data from a tree data structure according to the present disclosure.

FIG. 2 illustrates a block diagram of an example of a system to generate slice data from a tree data structure according to the present disclosure. The system 220 can perform a number of functions and operations as described in FIG. 3, (e.g., generating slice data to drive a 3-D printer). The system 220 can include a data store 221 connected to a user defined function system 222. In this example, the user defined function system 222 can include a number of computing engines. The example of FIG. 2 shows a specification engine 223, a merge engine 224, a scale engine 225, and a slice engine 226. As used herein, a computing engine can include hardware firmware, logic, and/or executable instructions, but includes at least hardware (e.g., a processor, transistor logic, application specific integrated circuit (ASIC), etc.), executing instructions to perform particular actions, tasks and functions described in more detail herein in reference to FIG. 3.

In the example of FIG. 2, the specification engine 223 can include hardware and/or a combination of hardware and programming (e.g., executable instructions), but at least hardware, to create, receive, and/or define a number of specifications of a 3-D object. A merge engine 224 can include hardware and/or a combination of hardware and programming, but at least hardware, to merge the specifications of the 3-D object to create a model of the 3-D object.

A scale engine 225 can include hardware and/or a combination of hardware and programming, but at least hardware, to scale the model of the 3-D object based on the resolution of the 3-D printer. A slice engine 226 can include hardware and/or a combination of hardware and programming, but at least hardware, to slice the model of the 3-D object and provide the slice data to a 3-D printer to generate the 3-D object.

The specification engine 223, the merge engine 224, the scale engine 225, and the slice engine 226 shown in FIG. 2 and/or the specification module 108, the merge module 109, the scale module 110, and the slice module 111 in FIG. 1 can be sub-engines/modules of other engines/modules and/or combined to perform particular actions, tasks, and functions within a particular system and/or computing device. Further, the engines and/or modules described in connection with FIGS. 1 and 2 can be located in a single system and/or computing device or reside in separate distinct locations in a distributed computing environment, (e.g., cloud computing environment). Examples are not limited to these examples.

Figure 3:
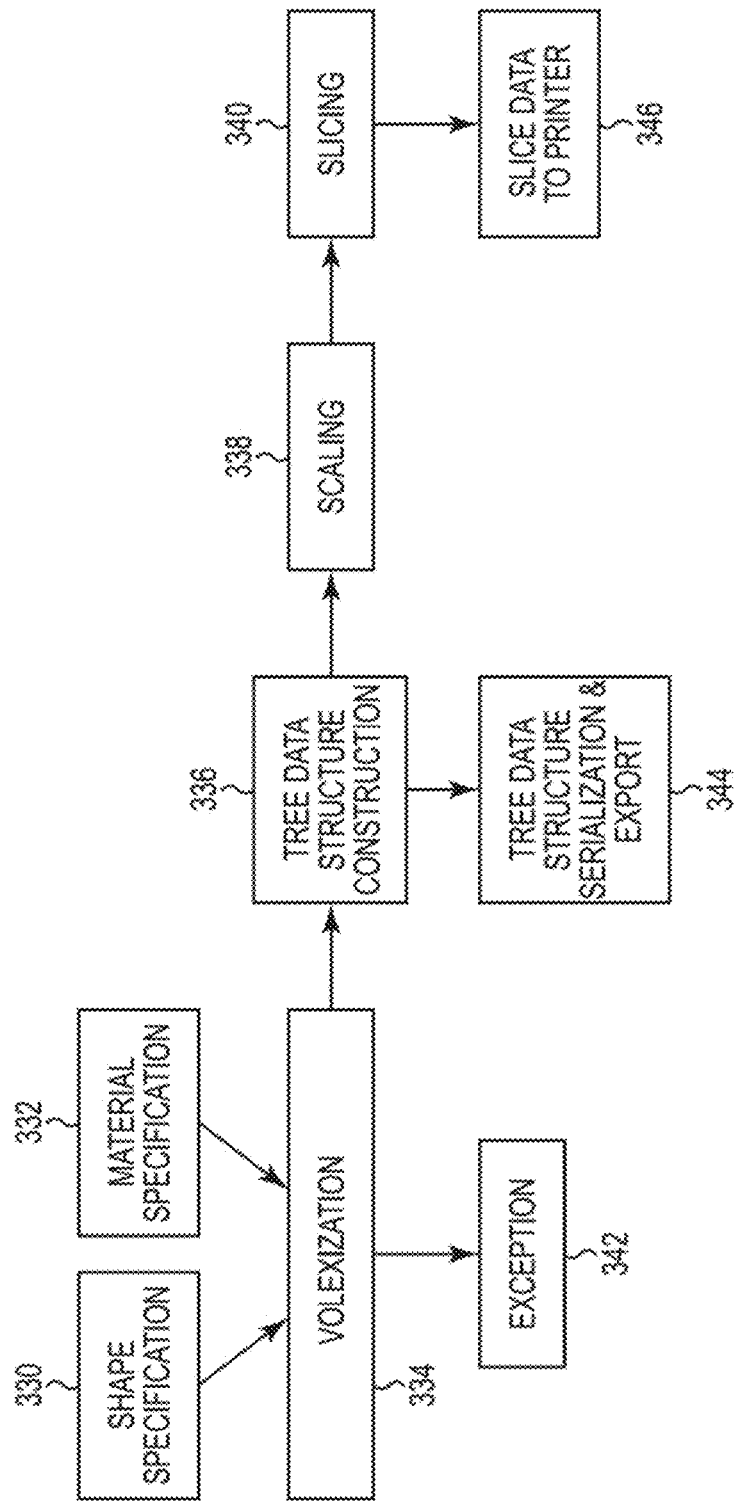
FIG. 3 illustrates a block diagram of an example of generating slice data from a tree data structure according to the present disclosure.

FIG. 3 illustrates a block diagram of an example of generating slice data from a tree data structure according to the present disclosure. FIG. 3 illustrates a shape specification 330, a material specification 332, a voxelization 334 of the shape specification 330 and the material specification 332 to merge the shape specification 330 with the material specification 332 to create model of the 3-D object. FIG. 3 also illustrates an exception 342, the construction of a tree data structure 336, the serialization export 344 of the tree data structure, the scaling 338 of the octree, the slicing 340 of the octree, and providing 346 the slice data to the 3-D printer (e.g., printer).

As used herein, creating the shape specification 330 and the material specification 332, merging the shape specification 330 and the material specification 332, creating a voxel representation of the shape specification 330 and the material specification 332, constructing a tree data structure 336, scaling 338 the tree data structure, and/or slicing 340 the data associated with the tree data structure can be part of a design process. The design process can be independent of a printing process which includes providing slice data to printer 346 and/or printing the slice data. For example, the design process can occur outside of a 3-D printer and/or a processing resource associated with the printer. The design process can also be part of the printing process. For example, the design process can be executed in a 3-D printer and/or in a processing resource associated with a 3-D printer.

In a number of examples the shape specification 330 can be a 3-D model that defines the shape of 3-D object. The shape specification 330 can define both the internal and the external portion of the 3-D object. The shape specification 330 can be a number of shape specifications 330. The number of shape specifications 330 can collectively define the 3-D object. For example, each of the number of shape specifications 330 can define a different portion of the 3-D object.

The shape specification 330 can be defined, for example, using polygon meshes. For example, the shape specification 330 can be defined using a number of formats such as a stereolithography (STL) file format, an OBJ file format, and/or an X3D file format, among other type of files formats.

A material specification 332 is a 3-D distribution of material types and/or material properties of a 3-D object. As used herein, the terms material type and material are used interchangeably. A material type can be a material. A material property can be an attribute of a material type. The material specification 332 can be a number of material specifications 332. For example, a first material specification 332 can define a first material type while a second material specification 332 can define a second material type, the first material type and the second material type comprising the materials (e.g., different materials) used in a 3-D object. However, the number of material specifications 332 can comprise more than two material specifications.

The material specifications 332 can also define a number of material properties associated with a material type and/or a plurality of material types that comprise the 3-D object. For example, if density and color of a material type are material properties associated with a material type, then a first material specification 332 can define a density of a material type and a second material specification 332 can define a color of a material type.

The material specification 332 can provide a description of material heterogeneity both inside a 3-D object and on the part surface of the 3-D object. The material specification 332 can describe a number of interactions between different material types and/or property types. For example the material specification 332 can describe discrete multi-material interactions, functionally graded multi-material interactions, and digitally engineered multi-material interactions.

A material (types or properties) distribution is specified independently of the shape specifications (e.g., vertices, elements, patches). A material specification can be a three dimensional mathematical function that describes a distribution of a material attribute (e.g., planar shapes) with continuous variation of a material quantity (e.g., thermal conductivity, a concentric shape, wavelets, etc.). A distribution can describe desired variations (discrete or continuous) in a 3-D space that enable the use of arbitrary material distribution patterns including both that of continuous (e.g., a concentric pattern) and that of discrete (e.g., a binary planar pattern). A distribution can be described via mathematical expressions or mappings from other digitized sources (e.g., images).

The shape specification 330 and the material specification 332 are independent of each other. That is, the shape specification 330 and the material specification 332 may not conform to each other. For example, a shape specification 330 can define the shape of a 3-D object while a material specification 332 can define a material outside the bounds of the shape of the 3-D object defined in the shape specification 332. However, such independence does not exclude the shape specification 330 from being part of the material specification 332 or the material specification 332 from being part of the shape specification 330. That is, such independence does not exclude the shape specification 330 and the material specification 332 from being saved in a same file.

The voxelization 334 of the shape specification 330 and the material specification 332 can define the merger of the shape specification 330 and the material specification 332. Merging the shape specification 330 and the material specification 332 can also be described as synthesizing the shape specification 330 and the material specification 332.

The shape specification 330 and the material specification 332 can be merged by fixing the six-degrees of freedom of one specification with respect to the other specification. For instance, center-of-mass (x, y, and z) can account for three-degrees of freedom while the three rotational angles (roll, yaw, and pitch) can account for an additional three-degrees of freedom. Fixing the center-of mass (x, y, and z) and three rotational angles (roll, yaw, and pitch) can merge the material specification 332 with respect to the shape specification 330 and as a result can bind the material specification 332 and the shape specification 330.

Merging the shape specification 330 and the material specification 332 can include scaling the shape specification 330 to a resolution of the material specification 332. Merging the shape specification 330 and the material specification 332 can also include scaling the material specification 332 to a resolution of the shape specification 330. The above scaling can be anisotropic using scaling vectors. That is, the above scaling can be directionally dependent using scaling vectors.

In a number of examples, multiple shape specifications 330 can be merged with one material specification 332 to define a 3-D object. For example, a first shape specification 330 and a second shape specification 330 can be merged with a material specification 332. That is, a material specification 330 can be used to describe a material distribution over multiple portions of a 3-D object. Multiple material specifications 332 can be merged with a shape specification to define the 3-D object. For examples, a first material specification 332 and a second material specification 332 can be merged with a shape specification 330. That is, multiple material specifications 330 can describe different material properties of the 3-D object. Multiple material specifications 332 can be merged with multiple shape specifications 330 to define the 3-D object. For example, a first material specification 332 can be merged with a first shape specification 330 and a second material specification 332 can be merged with a second shape specification 330 which can define the 3-D object. That is, a first portion of a 3-D object can be defined by the first material specification 332 and the first shape specification 330 and a second portion of the 3-D object can be defined by the second material specification 332 and the second shape specification 330. Moreover, a first material specification 332 can define the thermal conductivity of a portion (e.g., a part) of the 3-D object while a second material specification 332 can define the texture of the same portion of the 3-D object.

The merging of the shape specification 330 and the material specification 332 can be performed using a number of processing resources in parallel. A number of processing resources can include a number of CPUs and/or a number of graphical processing units (GPUs), for example.

Merging the shape specification 330 and the material specification 332 can include scan-converting the shape specification 330 described using a boundary mesh into a grid of voxels (e.g., 3-D grid of voxels). As used herein, a voxel represents a value on a 3-D space. A voxel can be a volume associated with the 3-D space. The voxel can have a value of solid, empty, or a differently defined description of the 3-D space. The position of a voxel can be inferred based upon its position relative to other voxels. The grid of voxels that is created from the merging of the shape specification 330 and the material specification 332 can be an example of a model of the 3-D object.

During the scan-converting of the shape specification 330 it can be determine whether shape specification 330 is watertight (e.g., air-tight). As used herein, watertight is used to describe a model that is suitable for 3-D printing. A watertight model indicates that there are no holes, cracks, or missing features in a model that would render the model unsuitable for 3-D printing. If the grid of voxels is not watertight then an exception 342 can be raised such that the scan-conversion process will terminate and reference a part of the grid of voxels that should be repaired to proceed with the 3-D printing of the 3-D object.

The scan-converting can also include transforming the material property values associated with the material specification 332 into different types of materials and/or material properties that make up the 3-D object. That is, the voxelization 334 of the shape specification 330 and the material specification 332 can include mapping voxels with materials and/or material properties described in the material specification 332.

A voxel can be mapped to material types and/or material properties by using a bottom-up parallelized construction to build up a tree data structure 336 while simultaneously evaluating the material types for each node in the tree data structure. A bottom-up parallelized construction can include traversing the grid of voxels. For example, a plurality of leaf nodes can be associated with the grid of voxels. The leaf nodes (e.g., level i) can be traverses upstream (e.g., from a leaf node to a rood node) to find non-leaf nodes at their parent level (e.g., level i-1). A node array can be created to hold nodes leaf nodes. The quantity of leaf nodes can be eight times the quantity of non-leaf nodes in level i-1. The nodes at each level (level i-2 level i-Q) in a tree structure can be added to the node array until the root node is reached.

The node array can be created in parallel. That is, different paths in the tree structure can be traverses in parallel to add nodes to the node array. After creating the node array, the materials associated with the leaf nodes can be defined based on the material specification 332. A hierarchical propagation can be used to identify the intersection voxels, which signify the change of material properties, and fill in material information into voxels between intersection voxels. The filling process is specified along an x-axis. However, the filling process can be along any pre-defined axis.

In a number of examples, a tree data structure suitable for mapping a grid of voxels with materials and/or material properties can be an octree. The octree can store the results of the voxelization 334 of the shape specification 330 and the material specification 332.

An octree can represent arbitrary shapes (e.g., convex, concave, and/or with holes) and can carry nodal attributes to represent any material distribution (e.g., material types and/or material properties). An octree can compress the voxel data structure by using the largest possible voxels to represent homogeneous regions. As used herein, a region is homogeneous when multiple neighboring nodes in the tree data structure (e.g., octree) have a uniformity of shape, material types, and/or material properties without shape boundaries, material type boundaries and/or material properties boundaries intersecting the multiple neighboring nodes.

An additional light-weight post-processing procedure, that is referred to herein as octree clipping, can be implemented to further examine the tree to merge neighboring homogenous nodes into one. Significant file size reduction of a file used to store the tree data structure can be achieved by performing post-processing octree clipping. Furthermore, tree data structure serialization export 344 (e.g., deserialization) can be implemented to allow writing an octree to a file for future use or for other applications. That is, an octree can be serialized and exported to provide a template of the 3-D object that can be referenced independently of the printing of the 3-D object on a particular 3-D printer. For example, an octree that is created to print a 3-D object on a first 3-D printer can be re-used to print the 3-D object on a second 3-D printer with a different printing resolution than the first 3-D printer without having to recreate the octree.

The tree data structure can be scaled 338 post-processing to meet the printing resolution of a particular 3-D printer. As used herein, post-processing refers to processing that occurs after the construction of the tree data structure 336. That is, the tree data structure can be scaled 338 independently of the construction of the tree data structure 336. Scaling 338 the tree data structure post-processing provides the ability to reuse a tree data structure to print a 3-D object on a plurality of 3-D printers with different printing resolutions without reconstructing the tree data structure multiple times.

In a number of examples, a scaling 338 of the tree data structure can be performed using a plurality of processors in parallel. A tree data structure with a particular resolution can be scaled to a higher resolution by examining and partitioning leaf nodes where deeper heterogeneity can be materialized while preserving the existing tree data structure. A tree data structure with a particular resolution can also be scaled 338 to a lower resolution by examining and merging leaf nodes that may include similarities while preserving the existing tree data structure. For example, the solid nodes in a bottom layer of the tree data structure can be merged to scale 338 a tree data structure to a lower resolution. Scaling 338 while preserving the existing tree data structure is referred to herein as graceful scaling because the tree data structure is not reconstructed but rather uses a previously existing tree data structure to further define (e.g., provide a higher resolution) the tree data structure.

Graceful scaling provides for efficient processing of the tree data structure. For example, a tree data structure can be computed and stored once with a default resolution using a shape specification 330 and material specification 332. A printing resolution and a number of materials allowed by a 3-D printer can be obtained to print a 3-D object using the tree data structure. The printing resolution and the number of materials can be compared to default resolution of the tree data structure and the number of materials used in the tree data structure. Based on the comparison, the tree data structure can be scaled 338 to meet the resolution of a particular 3-D printer. In a number of examples, the tree data structure can be reevaluated to remove redundant nodes after the tree data structure is scaled 338.

Figure 6:
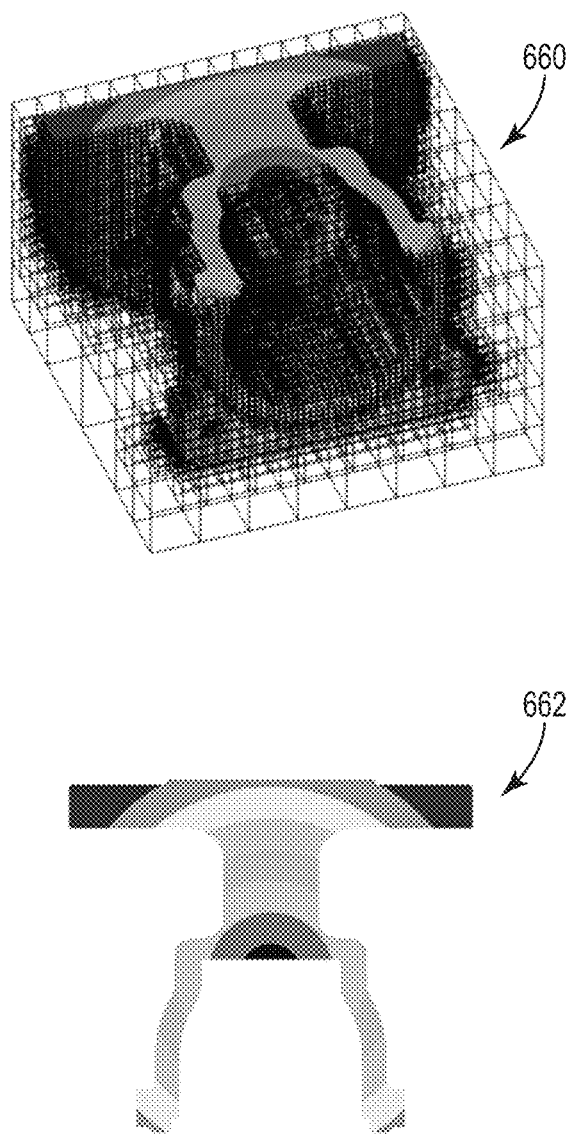
FIG. 6 illustrates an example of slice data according to the present disclosure.
Figure 7:
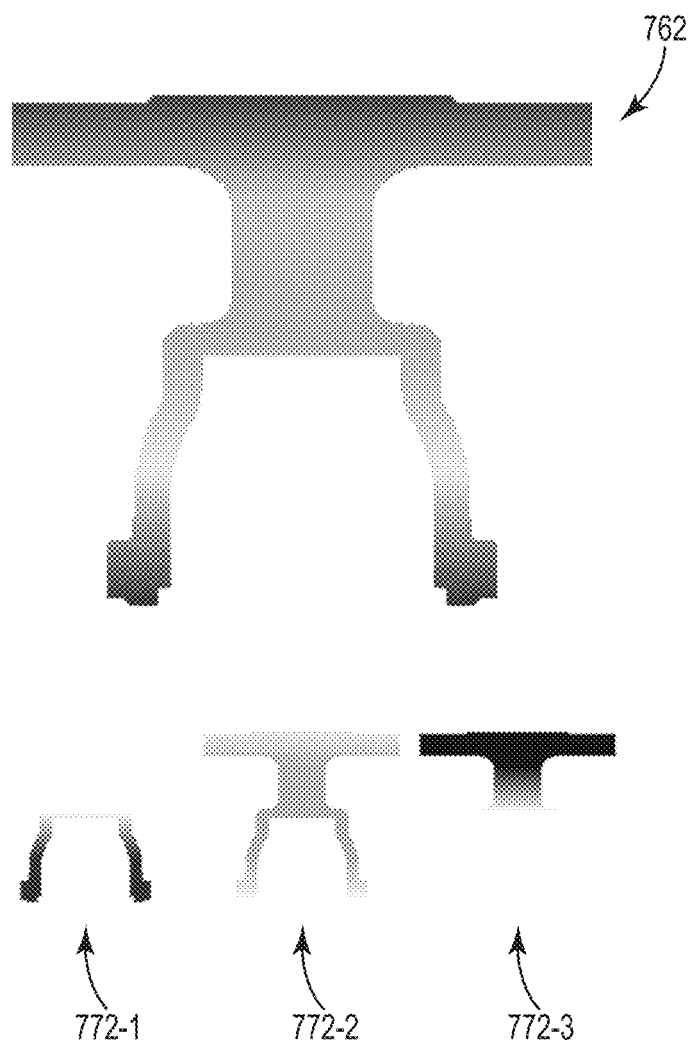
FIG. 7 illustrates an example of a slice of data according to the present disclosure.

The tree data structure can be sliced 340 to provide slice data to the 3-D printer. The tree data structure can be sliced 340 after the construction 336 of the tree data structure and/or the scaling 338 of the tree data structure. As used herein, slice data is a portion of the data inscribed in the tree data structure. FIGS. 6 and 7 provide examples of slice data.

The tree data structure can be sliced 340 by implementing a top-down traversal of the tree data structure on a number of CPUs and/or GPUs and by associating neighboring nodes with each other. Neighboring nodes can be associated, for example, using node levels. That is, a tree hierarchy associated with the tree data structure can be defined. In a number of examples, the tree hierarchy associated with the tree data structure can be defined at a voxelization 334 of the shape specification 330 and/or the material specification 332, during a construction of the tree data structure 336, and/or during the scaling 338 of the tree data structure. Implementing a top-down traversal of the tree data structure and a grouping of nodes can accelerate the slicing 340 of the tree data structure.

Slicing 340 the tree data structure can include identifying a z-coordinate of a slice plane. The z-coordinate of the slice plane can be used to traverse the tree data structure to identify relevant nodes intercepted by the slice plane. The shape and material attributes associated with the relevant nodes can be collected to comprise the slice data. In a number of examples, the slice data can be further separated into a number of bitmaps per material types which can be transmitted to the printer to drive the printing of the 3-D object (e.g., drive the material deposition and object forming). FIG. 7 provides an example of separating the slice data into a number of bitmaps.

Providing 346 the slice data to the printer can include progressively streaming the slice data to a 3-D printer to enable the printing of the 3-D object. Streaming the slice data can provide ability to print large and complex 3-D objects without overburdening the printer networking and storage associated with the 3-D printer. Streaming the slice data can reduce the storage space used by the 3-D printer to receive the slice data because the slice data that is streamed to the 3-D printer does not describe the entire 3-D object at once but rather provides a portion of a description of the 3-D object at a given time.

The slicing of a tree data structures in a 3-D printer will be bounded by the CPU and memory installed in the 3-D printer. Uploading slice data to the 3-D printer will be bound by the storage space installed in the 3-D printer.

A computing device can slice the tree data structure using parallelized GPUs. The computing device can also stream the slice data to the 3-D printer. Streaming the slice data to the 3-D printer can include streaming a single slice or a plurality of slices at a given time. The rate of slices from the slice data streamed to the 3-D printer can be associated with the storage space available to the 3-D printer and the time to print a layer a layer using the 3-D printer. For example, if a first slice of slice data can be provided to the 3-D printer, then a second slice of data can be provided to the 3-D printer after the 3-D printer prints the a portion of the 3-D object associated with the slice of data.

In a number of examples, the slice data can be continuously streamed to the printer until a total unprinted slice count stored at the 3-D printer is equal to a particular number of slices (e.g., a user set number bound by storage limitation in printer). In a number of examples, the slice data that has been printed is discarded.

A first-in-first-out queue can be used to store streamed slices in the 3-D printer. The queue length (N) can be bound by the storage space in the 3-D printer. A 3-D printer can pull a slice of the slice data (e.g., current slice) from the head of a queue, print the pulled slice, and/or discard the printed slice. The 3-D printer can request additional slice data from the slice engine 226 if there is an empty cell in queue. The slice engine 226 can process an additional slice and provide the additional slice to the 3-D print.

Figure 4:
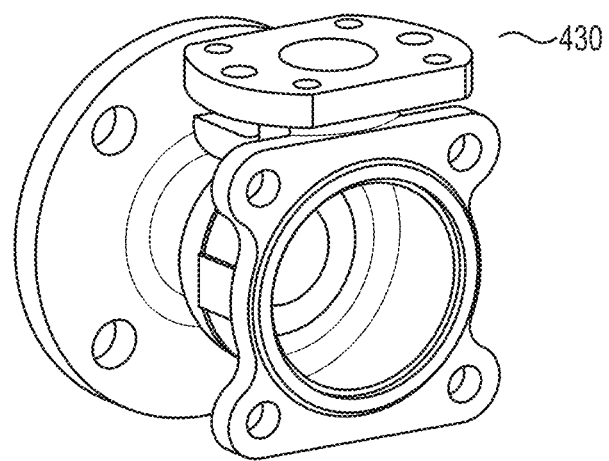
FIG. 4 illustrates an example of a specification according to the present disclosure.
Figure 4:
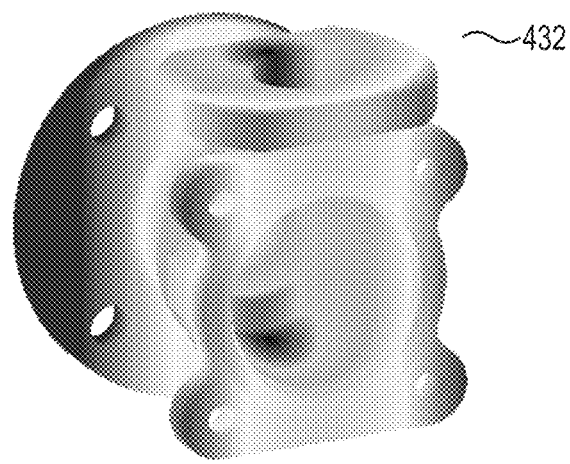

FIG. 4 illustrates an example of a specification according to the present disclosure. FIG. 4 includes a shape specification 430 and a material specification 432 which are analogous to the shape specification 330 and the material specification 332 in FIG. 3.

The shape specification 430 and the material specification 432 are independent of each other. That is, the shape specification 430 and the material specification 432 may not conform to each other. For example, a shape specification 430 can define the shape of a 3-D object while a material specification 432 can define a number of materials and/or material properties outside the bounds of the shape of the 3-D object defined in the shape specification 430. FIG. 4 shows an image clipping of the material specification 432 by the shape specification 430 to achieve better visual effects. Such clipping is not necessary. In FIG. 4, material specification 432 is a planner and continuous 3-D distribution that can describe a material type and/or a material property associated with the 3-D object.

Figure 5:
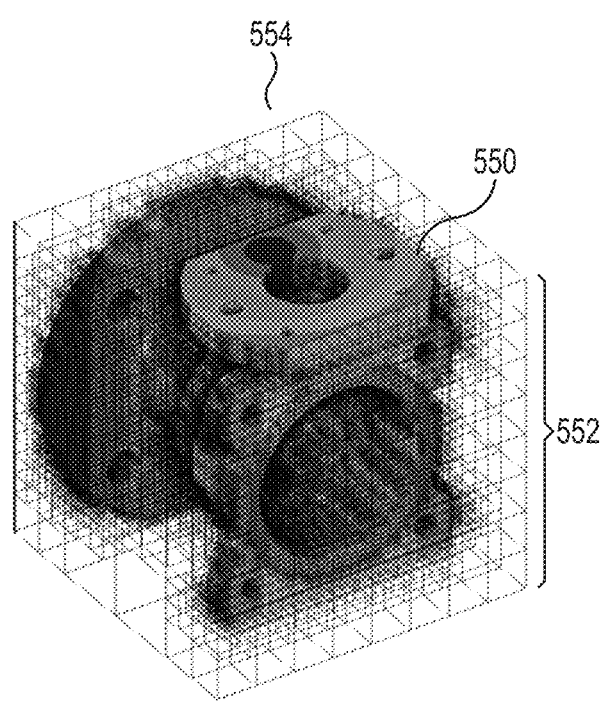
FIG. 5 illustrates an example of a grid of voxels according to the present disclosure.

FIG. 5 illustrates an example of a grid of voxels according to the present disclosure. FIG. 5 illustrates a 3-D object 550, a grid of voxels 554, and a plurality of individual voxels 552.

As illustrated in FIG. 5, each voxel 552 is represented by a cube. However, other shapes can be used to represent a voxel. Each of the plurality of voxels 552 can have different dimensions. For example, a first voxel from the grid of voxels 554 can define a first volume while a second voxel from the grid of voxels 554 can define a second volume. A resolution associated with the grid of voxels 554 and/or a tree data structure that corresponds to the grid of voxels 554 can be defined by a smallest voxel from the grid of voxels 554. A smallest voxel can be defined in terms of volume, area, material type and/or material property discretization, and/or any other standard provided for comparing voxels.

In FIG. 5, the volume associated with a given voxel 552 can decrease to accommodate the shape of the 3-D object 550. For example, a first shape associated with the 3-D object 550 may be represented using a first number of voxels 552 where each of the first number of voxels 552 has a first volume. A second shape associated with the 3-D object 550 that is less intricate than the first shape may be represented using a second number of voxels 552 where each of the second number of voxels 552 has a second volume that is greater than the first volume.

FIG. 6 illustrates an example of slice data according to the present disclosure. FIG. 6 shows a cut 660 along a particular y-axis. The particular y-axis is also referred to herein as a build direction. When the slice data is provided to a 3-D printer, the 3-D printer prints the 3-D object by solidifying the data provided by the slice data along the build direction (e.g., y-axis). In a number of examples, the cut 660 can be along a different axis. For example, the cut 660 can be along an x-axis and/or along a z-axis. FIG. 6 also shows a slice 662 of slice data taken along a particular plane. The slice plane can be perpendicular to the build direction.

The slice 662 shows the shape of the 3-D object and a number of material types and/or material properties associated with the slice 662. In a number of examples, the slice 662 can have a thickness equal to a voxel or a plurality of voxels as defined by the tree data structure. The slice 662 can also have a thickness that is independent of the voxel size. The slice thickness can be defined by the difference of the z-coordinates of two sequentially cutting planes. The z-coordinates can be specified externally from the 3-D printer.

FIG. 7 illustrates an example of a slice of data according to the present disclosure. Slice 762 is analogous to slice 662 in FIG. 6. Slice 762 defines a number of material types and/or material properties that can be associated with the slice 762. In the example provided in FIG. 7 each of 772-1, 772-2, and 772-3 define a portion of slice 762.

That is slice 762 is a mixture of three different material types (e.g., types of materials). Slice 762 can be separated into portions 772-1, 772-2, and 772-3. Each of the portions 772-1, 772-2, and 772-3 can define a different material type.

Portions 772-1, 772-2, and 772-3 can be used by a 3-D printer to drive the printer to deposit materials associated with portions 772-1, 772-2, and 772-3. For example, a first material can be associated with portion 772-1, a second material can be associated with portion 772-2, and/or a third material can be associated with portion 772-3. The portions 772-1, 772-2, and 772-3 that comprise a slice 762 can be deposited along a same plane. The mixture of all portions 772-1, 772-2, and 772-3 defines slice 762.

The portions 772-1, 772-2, and 772-3 are defined in terms of the shape specification and a number of material properties. The portions 772-1, 772-2, and/or 772-3 are referred to herein as portions 772. The present disclosure is not so limited and can include more or less portions that those described herein.

The portions can be provided using bitmaps. That is, each of the portions 772 can be a different bitmap that can be provided to a 3-D printer for printing the 3-D object.

The portions 772 can collectively define a slice 762. Associating each of the portions 772 with a different material type and/or material property provides for a continuous gradation of the material types and/or material properties in slice 762.

Figure 8:
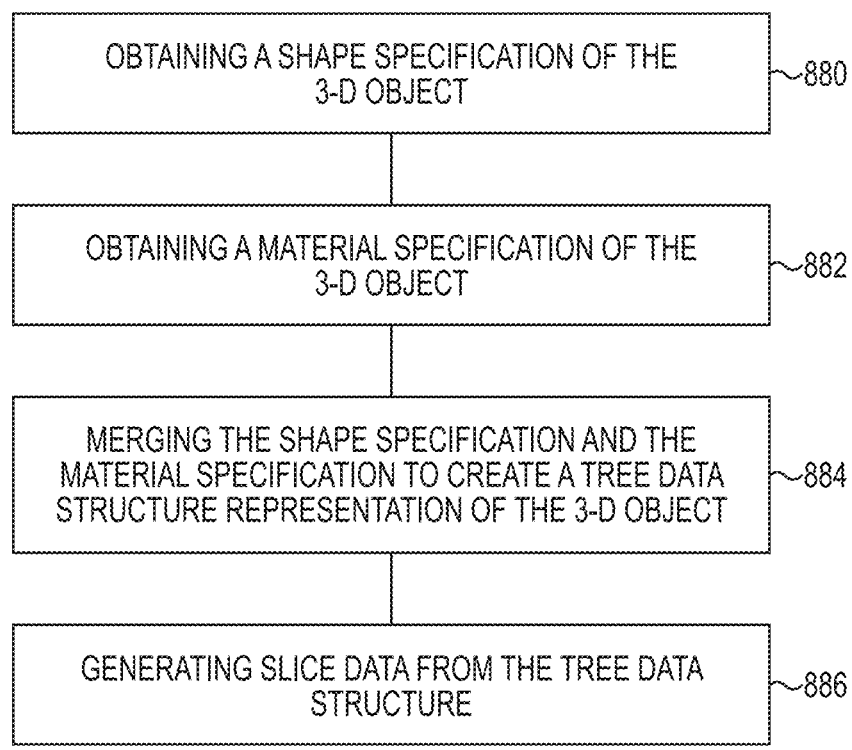
FIG. 8 illustrates a flow diagram of an example of a method for generating slice data from a tree data structure according to the present disclosure.

FIG. 8 illustrates a flow diagram of an example of a method for generating slice data from a tree data structure according to the present. As shown at 880, a method can include obtaining a shape specification of the 3-D object. The shape specification can be a 3-D model of the 3-D object. As shown at 882, the method can include obtaining a shape specification of the 3-D object. In a number of examples, the shape specification and the material specification can be independent from each other. The material specification can be a 3-D distribution of materials and/or material properties. In a number of examples, material properties can define a number of material types and/or a number of material attributes of a material type.

As shown at 884, the method can include merging the shape specification and the material specification to create a tree data structure representation of the 3-D object. Merging the shape specification and the material specification can include creating a grid of voxels from the shape specification and mapping the material specification with the grid of voxels. Mapping the material specification can also include mapping the material property values from the material specification to the grid of voxels and assigning the material property values to the grid of voxels. Merging the shape specification and the material specification can also include converting the grid of voxels into a tree data structure. As shown at 886, the method can include generating slice data from a tree data structure representing the 3-D printer.

In the present disclosure, reference is made to the accompanying drawings that form a part hereof, and in which is shown by way of illustration how a number of examples of the disclosure can be practiced. These examples are described in sufficient detail to enable those of ordinary skill in the art to practice the examples of this disclosure, and it is to be understood that other examples can be used and that process, electrical, and/or structural changes can be made without departing from the scope of the present disclosure.

The figures herein follow a numbering convention in which the first digit corresponds to the drawing figure number and the remaining digits identify an element or component in the drawing. Elements shown in the various figures herein can be added, exchanged, and/or eliminated so as to provide a number of additional examples of the present disclosure. The proportion and the relative scale of the elements provided in the figures are intended to illustrate the examples of the present disclosure, and should not be taken in a limiting sense.

The specification examples provide a description of the applications and use of the system and method of the present disclosure. Since many examples can be made without departing from the spirit and scope of the system and method of the present disclosure, this specification sets forth some of the many possible example configurations and implementations.

As used herein, "a" or "a number of" something can refer to one or more such things. For example, "a number of widgets" can refer to one or more widgets.

What is claimed:

1. A method to generate slice data from a tree data structure comprising:
   obtaining a shape specification of a 3-D object;
   obtaining a material specification of the 3-D object;
   merging the shape specification and the material specification to create the tree data structure representation of the 3-D object, wherein the merging includes directionally dependent scaling of the shape specification and the material specification using scaling vectors;
   generating slice data from the tree data structure; and
   separating the slice data into a plurality of bitmaps per material type to provide to a printer to drive a printing of the 3-D object.

2. The method of claim 1, wherein the material specification is independent of the shape specification.

3. The method of claim 1, wherein the material specification is a 3-D distribution of materials.

4. The method of claim 3, wherein the material specification describes a plurality of properties of a material that is associated with the 3-D object.

5. The method of claim 4, wherein the plurality of properties of the material includes a type of material that is associated with the 3-D object.

6. The method of claim 1, wherein merging the shape specification and the material specification includes creating a grid of voxels from the shape specification.

7. The method of claim 6, wherein merging the shape specification and the material specification includes:
   mapping material property values from the material specification to the grid of voxels; and
   assigning the material property values to the grid of voxels.

8. A non-transitory machine-readable medium storing instructions to generate slice data from a tree data structure, the instructions executable by a machine to cause the machine to:
   obtain at least one shape specification of a 3-D object;
   obtain at least one material specification of the 3-D object;
   merge the at least one shape specification and the at least one material specification to create an octree representation of the 3-D object, wherein the merging includes directionally dependent scaling of the at least one shape specification and the at least one material specification using scaling vectors;
   merge neighboring homogenous nodes from the octree to clip the octree;
   generate slice data from the octree; and
   separate the slice data into a plurality of bitmaps per material type to provide to a 3D printer.

9. The medium of claim 8, wherein the at least one material specification does not conform to the at least one shape specification.

10. The medium of claim 8, wherein the instructions executable to merge the at least one shape specification and the at least one material specification include instructions to merge a shape specification from the at least one shape specification with a plurality of material specifications from the at least one material specification.

11. The medium of claim 8, wherein the instructions executable to merge the at least one shape specification and the at least one material specification include instructions to merge a material specification from the at least one material specification with a plurality of shape specifications from the at least one shape specification.

12. The medium of claim 8, wherein the instructions executable to merge the at least one shape specification and the at least one material specification include instructions to:
   scale the at least one shape specification to a resolution associated with the at least one material specification; and
   fix six degrees of freedom from the at least one shape specification to the at least one material specification.

13. A system to generate slice data from a tree data structure, comprising:
   a specification engine to:
      obtain a plurality of shape specifications of a 3-D object;
      obtain a plurality of material specifications of the 3-D object;
   a merge engine to merge the plurality of shape specifications and the plurality of material specifications to create an octree representation of the 3-D object, wherein the merging includes directionally dependent scaling of the plurality of the shape specifications and the plurality of the material specifications using scaling vectors;

a scale engine to scale the octree to a resolution associated with a 3-D printer;

a slice engine to provide slice data from the octree to a separate engine; and the separate engine to separate the slice data into a plurality of bitmaps per material type and to provide the separated plurality of bitmaps to the 3-D printer.

14. The system of claim 13, wherein the scale engine:

divides cells in the octree to provide a higher resolution than undivided cells; and merges cells in a bottom layer of the octree to provide a lower resolution.

15. The system of claim 13, wherein the scale engine scales the octree using an already existing octree without recreating the octree from the plurality of shape specifications and the plurality of material specifications.

* * * * *